United States Patent
Nakaoka

(10) Patent No.: US 11,270,751 B2
(45) Date of Patent: Mar. 8, 2022

(54) PSEUDO STATIC RANDOM ACCESS MEMORY AND METHOD FOR WRITING DATA THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/857,199

(22) Filed: Apr. 24, 2020

(65) Prior Publication Data

US 2020/0381041 A1 Dec. 3, 2020

(30) Foreign Application Priority Data

May 30, 2019 (JP) .............................. JP2019-101115

(51) Int. Cl.
| | |
|---|---|
| *G11C 7/00* | (2006.01) |
| *G11C 11/406* | (2006.01) |
| *G11C 11/4096* | (2006.01) |
| *G11C 11/4091* | (2006.01) |
| *G11C 11/4076* | (2006.01) |

(52) U.S. Cl.
CPC .... *G11C 11/40615* (2013.01); *G11C 11/4076* (2013.01); *G11C 11/4091* (2013.01); *G11C 11/4096* (2013.01); *G11C 2211/4066* (2013.01)

(58) Field of Classification Search
CPC .................. G11C 11/40615; G11C 2211/4066
See application file for complete search history.

(56) References Cited

U.S. PATENT DOCUMENTS

| | | | |
|---|---|---|---|
| 6,269,041 B1 | 7/2001 | Wang et al. | |
| 8,917,568 B2 | 12/2014 | Chen et al. | |
| 2001/0052808 A1* | 12/2001 | Hamamoto | ............. H03L 7/091 327/291 |
| 2009/0161468 A1* | 6/2009 | Fujioka | ............. G11C 11/40615 365/222 |
| 2014/0022858 A1* | 1/2014 | Chen | ................ G11C 11/40603 365/222 |

FOREIGN PATENT DOCUMENTS

| | | |
|---|---|---|
| CN | 1624801 | 6/2005 |
| TW | 200502968 | 1/2005 |

OTHER PUBLICATIONS

"Office Action of Taiwan Counterpart Application", dated Apr. 15, 2021, pp. 1-7.

* cited by examiner

*Primary Examiner* — Uyen Smet
(74) *Attorney, Agent, or Firm* — JCIPRNET

(57) ABSTRACT

A pseudo static random access memory and a method for writing data thereof are provided. In the method, a basic clock signal having a basic cycle is provided. A chip enable signal is enabled to perform a write operation and write data is received during an enabled time interval of the chip enable signal. A plurality of internal clock signals is generated sequentially at intervals of the basic cycle according to a write command enable signal. A refresh conflict signal is received and it is determined whether the refresh conflict signal is enabled. When the refresh conflict signal is enabled, the internal clock signals are delayed, and the write data is written to a selected sensing amplifier according to the delayed internal clock signals.

15 Claims, 11 Drawing Sheets

PSEUDO STATIC RANDOM ACCESS MEMORY AND METHOD FOR WRITING DATA THEREOF

CROSS-REFERENCE TO RELATED APPLICATION

This application claims the priority benefit of Japan application serial no. 2019-101115, filed on May 30, 2019. The entirety of the above-mentioned patent application is hereby incorporated by reference herein and made a part of this specification.

BACKGROUND

Technical Field

The invention relates to a control method of a memory, and particularly relates to a pseudo static random access memory and a method for writing data thereof.

Description of Related Art

In recent years, as an integration level of semiconductor memory devices becomes higher and higher and there is a need for higher speed, demand for pseudo static random access memory, which has advantages of both static random access memory and dynamic random access memory, continues to grow, especially in mobile devices.

The pseudo static random access memory is a memory element having a cell structure of the dynamic random access memory and a peripheral circuit of the static random access memory. Although the pseudo static random access memory has advantages of large capacity and low cost, the need for periodic refresh operations has to be considered. When the refresh operation conflicts with a write operation, the existing pseudo static random access memory generally maintains reliability of data by shortening a refresh period, but the above-mentioned method will lead to increase of a current during standby, which results in increase of power consumption.

SUMMARY

The invention is directed to a pseudo static random access memory and a method for writing data thereof, which are adapted adjust an internal clock signal to avoid conflict of a refresh operation and a write operation.

The invention provides a method for writing data, which is adapted to a pseudo static random access memory. The method for writing data includes: providing a basic clock signal having a basic cycle; enabling a chip enable signal to perform a write operation, and receiving write data during an enabled time interval of the chip enable signal; sequentially generating a plurality of internal clock signals at intervals of the basic cycle according to a write command enable signal; receiving a refresh conflict signal and determining whether the refresh conflict signal is enabled; and when the refresh conflict signal is enabled, delaying the internal clock signals, and writing the write data to a selected sensing amplifier according to the delayed internal clock signals.

The invention provides a pseudo static random access memory including a controller, an internal clock generator and a write buffer. The controller is configured to receive a basic clock signal having a basic cycle and a chip enable signal. The internal clock generator is coupled to the controller, and is configured to sequentially generate a plurality of internal clock signals at intervals of the basic cycle according to a write command enable signal transmitted by the controller. The write buffer is coupled to the controller and the internal clock generator, and is configured to write the write data to a selected sensing amplifier according to the internal clock signals, where when a refresh conflict signal is enabled, the internal clock generator delays the internal clock signals.

Based on the above description, the pseudo static random access memory of the invention is capable of sequentially generating a plurality of internal clock signals at intervals of the basic cycle. When the refresh operation conflicts with the write operation, the pseudo static random access memory of the invention is capable of delaying a time of the write operation by delaying the internal clock signals without shortening the refresh period, so as to smoothly perform the refresh operation and the write operation.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
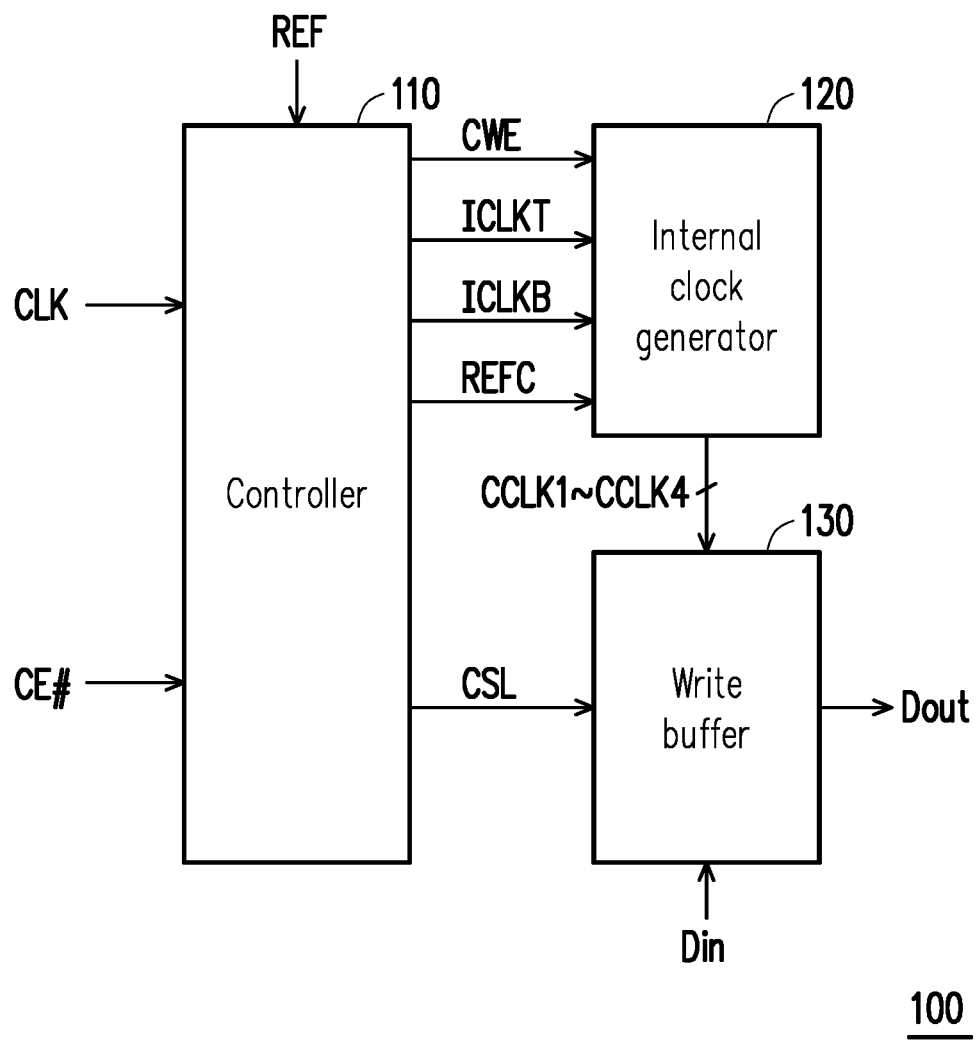
FIG. 1 is a block schematic diagram of a pseudo static random access memory according to an embodiment of the invention.

Referring to FIG. 1, FIG. 1 is a block schematic diagram of a pseudo static random access memory according to an embodiment of the invention. The pseudo static random access memory 100 includes a controller 110, an internal clock generator 120 and a write buffer 130. The controller 110 is configured to receive a basic clock signal CLK having a basic cycle and a chip enable signal CE #.

Figure 2:
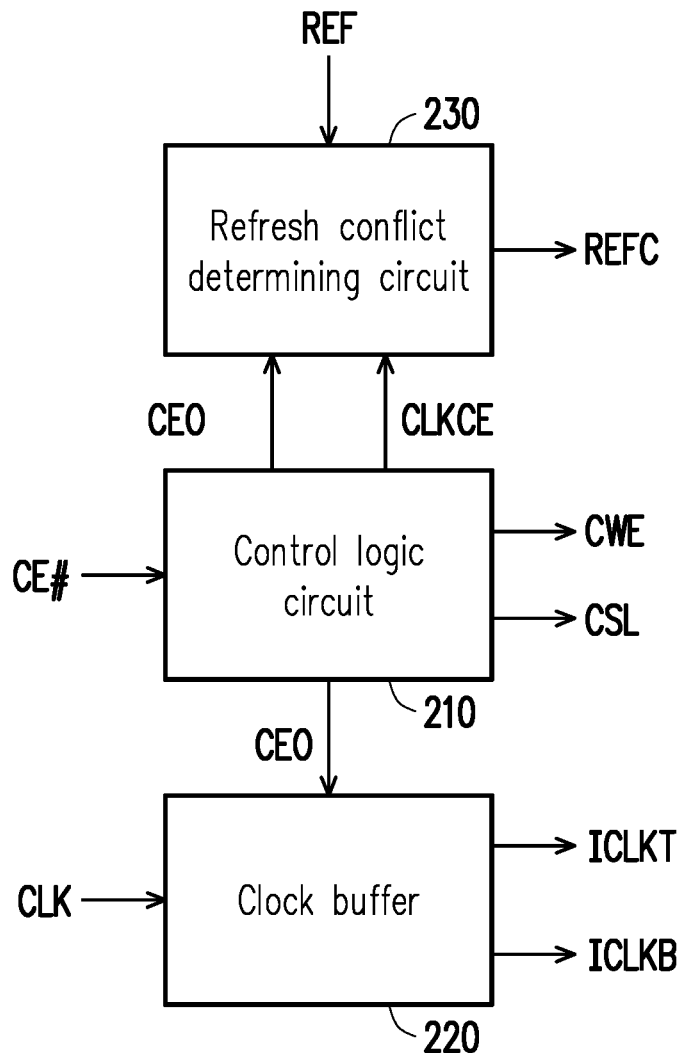
FIG. 2 is a block schematic diagram of a controller according to an embodiment of the invention.

The controller 110 may be a logic circuit constructed by a plurality of logic gates (but the invention is not limited thereto). For example, FIG. 2 is a block schematic diagram of a controller according to an embodiment of the invention. In FIG. 2, the controller 110 includes a control logic circuit 210, a clock buffer 220 and a refresh conflict determining circuit 230. The control logic circuit 210 may generate a chip enable signal CE0 for internal use of the memory according to the chip enable signal CE #. Moreover, the control logic circuit 210 may be triggered by the chip enable signal CE # to generate an enable single-pulse signal CLKCE. In addition, when a write operation is to be performed, the control logic circuit 210 may enable a write command enable signal CWE, and output a control signal CSL to control the write operation.

The clock buffer 220 is coupled to the control logic circuit 210. The clock buffer 220 may generate a positive reference clock signal ICLKT and an inverted reference clock signal ICLKB during an enabled time interval of the chip enable signal CE0 according to the chip enable signal CE0 and the basic clock signal CLK.

The refresh conflict determining circuit 230 is coupled to the control logic circuit 210. The refresh conflict determining circuit 230 is configured to receive a refresh signal REF indicating to perform a refresh operation and the enable single-pulse signal CLKCE. The refresh signal REF is, for example, periodically enabled by a timer (not shown), so as to periodically perform a refresh operation of the pseudo static random access memory 100. Moreover, the refresh conflict determining circuit 230 enables a refresh conflict signal REFC according to the chip enable signal CE0 and the refresh signal REF when the enable single-pulse signal CLKCE is generated.

Figure 3:
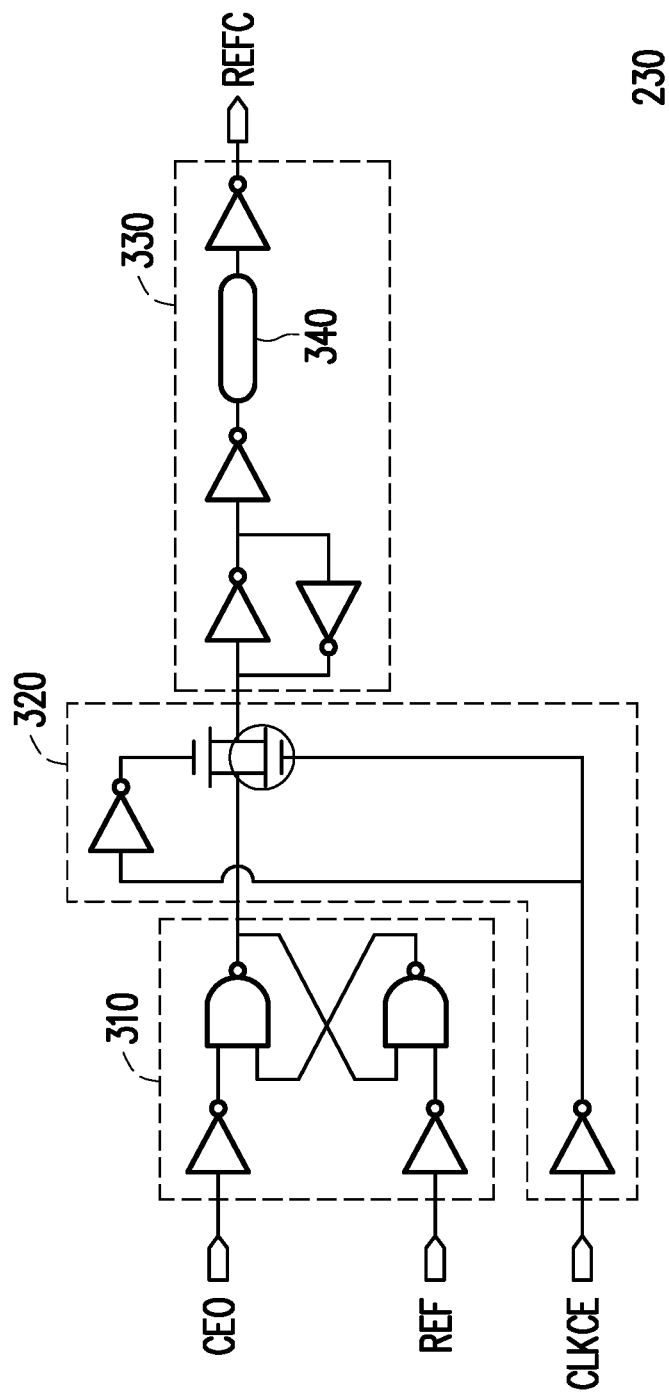
FIG. 3 is a schematic diagram of a refresh conflict determining circuit according to an embodiment of the invention.

For example, FIG. 3 is a schematic diagram of a refresh conflict determining circuit according to an embodiment of the invention. Referring to FIG. 3, the refresh conflict determining circuit 230 includes a latch circuit 310, a switch circuit 320 and a buffer circuit 330. The buffer circuit 330 includes a delay unit 340. The latch circuit 310 receives the refresh signal REF and the chip enable signal CE0. When the enable single-pulse signal CLKCE is generated, the switch circuit 320 is turned on. At this moment, if the chip enable signal CE0 corresponding to the write operation and the refresh signal REF corresponding to the refresh operation are simultaneously enabled (for example, the chip enable signal CE0 is pulled down to a low logic level, and the refresh signal REF is pulled up to a high logic level), the refresh conflict signal REFC is enabled through the buffer circuit 330 based on the configuration of the latch circuit 310.

Referring to FIG. 1, in FIG. 1, the internal clock generator 120 is coupled to the controller 110. The internal clock generator 120 is configured to sequentially generate 4 internal clock signals ICLK1-ICLK4 at intervals of the basic cycle according to the write command enable signal CWE transmitted by the controller 110. Cycles of each of the internal clock signals ICLK1-ICLK4 are the same, and are an integer multiple of the basic cycle (for example, 8 times). Moreover, the internal clock generator 120 may convert the internal clock signals ICLK1-ICLK4 into 4 single-pulse clock signals CCLK1-CCLK4.

Figure 4:
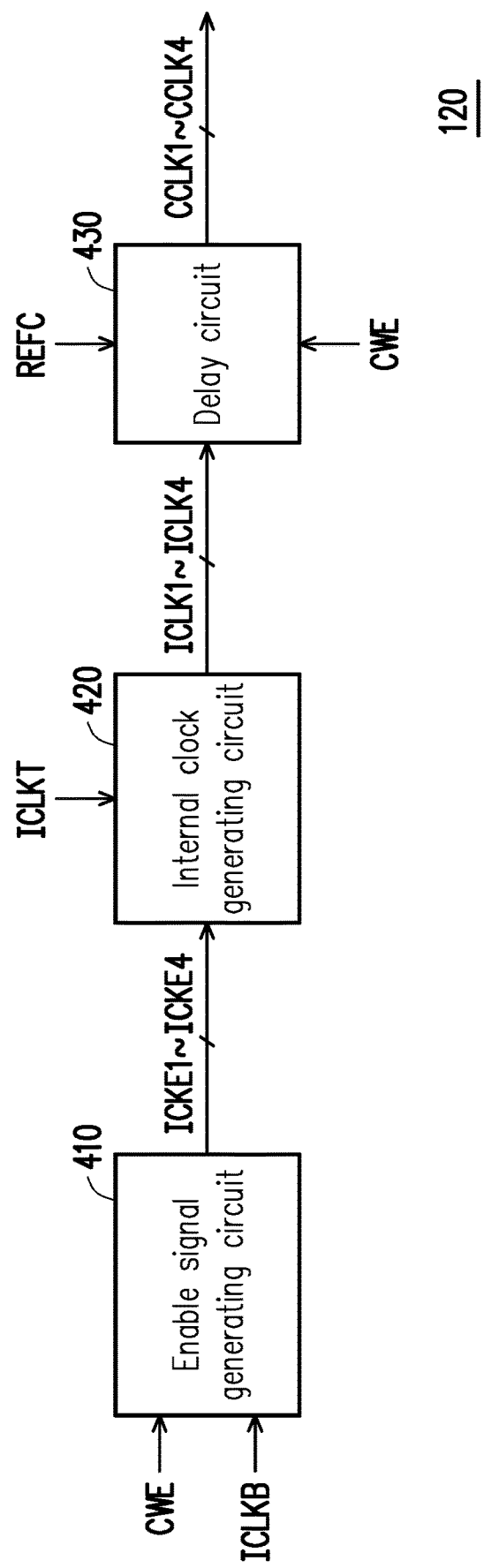
FIG. 4 is a block schematic diagram of an internal clock generator according to an embodiment of the invention.

For example, FIG. 4 is a block schematic diagram of an internal clock generator according to an embodiment of the invention. The internal clock generator 120 includes an enable signal generating circuit 410, an internal clock generating circuit 420 and a delay circuit 430. The enable signal generating circuit 410 is configured to sequentially generate 4 internal clock enable signals ICKE1-ICKE4 at intervals of the basic cycle according to the write command enable signal CWE and the inverted reference clock signal ICLKB.

The internal clock generating circuit 420 is coupled to the enable signal generating circuit 410. The internal clock generating circuit 420 is configured to generate the internal clock signals ICLK1-ICLK4 according to the internal clock enable signals ICKE1-ICKE4 and the positive reference clock signal ICLKT.

The delay circuit 430 is coupled to the internal clock generating circuit 420. When the refresh conflict signal REFC is enabled, the delay circuit 430 may delay the internal clock signals ICLK1-ICLK4. To be specific, the delay circuit 430 may receive the refresh conflict signal REFC and the write command enable signal CWE, and determine whether to delay the internal clock signals ICLK1-ICLK4 and the write command enable signal CWE according to the refresh conflict signal REFC.

When the refresh conflict signal REFC is enabled, the delay circuit 430 may greatly delay the internal clock signals ICLK1-ICLK4 and the write command enable signal CWE, and convert the delayed internal clock signals ICLK1-ICLK4 into 4 single-pulse clock signals CCLK1-CCLK4. Then, the delay circuit 430 may transmit the single-pulse clock signals CCLK1-CCLK4 to the write buffer 130.

When the refresh conflict signal REFC is not enabled, the delay circuit 430 does not greatly delay the internal clock signals ICLK1-ICLK4 and the write command enable signal CWE, but directly converts the undelayed internal clock signals ICLK1-ICLK4 into the 4 single-pulse clock signals CCLK1-CCLK4. Then, the delay circuit 430 may transmit the single-pulse clock signals CCLK1-CCLK4 to the write buffer 130.

Referring back to the FIG. 1, in the FIG. 1, the write buffer 130 is coupled to the controller 110 and the internal clock generator 120. The write buffer 130 is configured to output write data Din as output data Dout for writing to at least one selected sensing amplifier (not shown) in a memory array according to the single-pulse clock signals CCLK1-CCLK4 converted from the internal clock signals ICLK1-ICLK4 and the control signal CSL.

Figure 5:
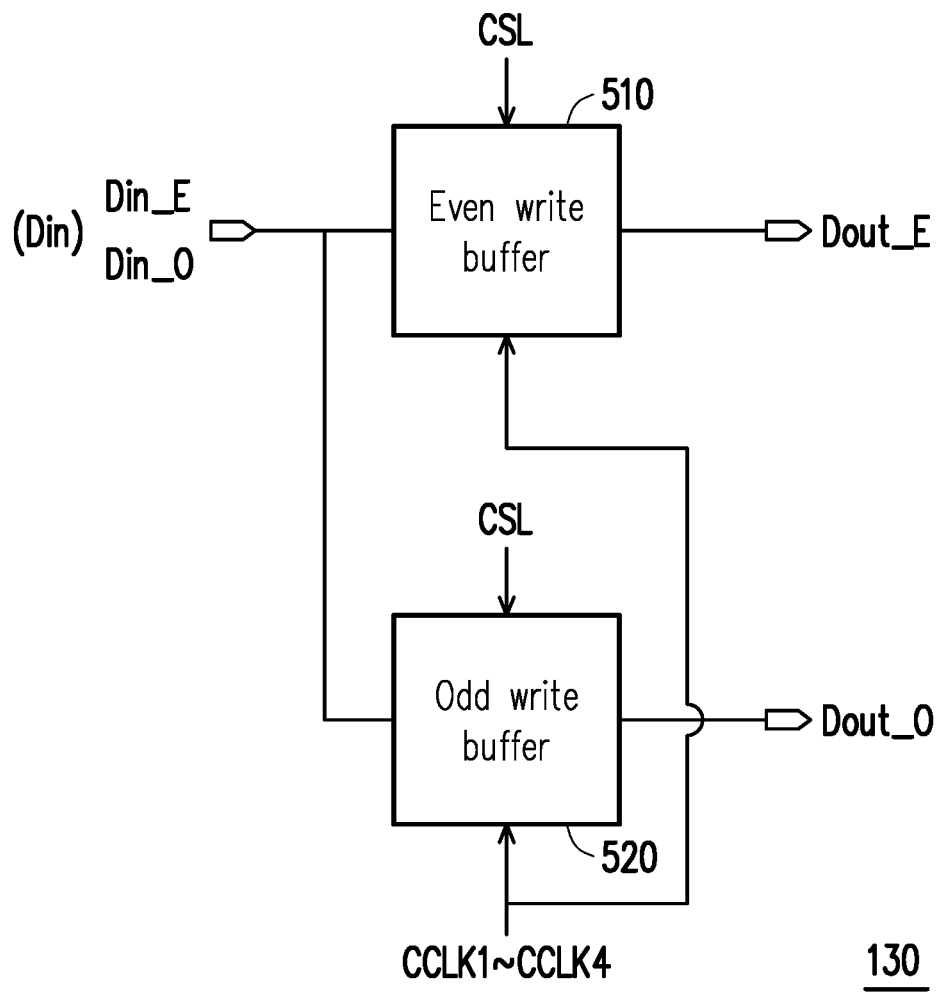
FIG. 5 is a block schematic diagram of a write buffer according to an embodiment of the invention.

To be specific, FIG. 5 is a block schematic diagram of a write buffer according to an embodiment of the invention. The write buffer 130 includes an even write buffer 510 and an odd write buffer 520. The write data Din may include odd data Din_O and even data Din_E. The write buffer 130 may simultaneously write odd data Dout_O and even data Dout_E to the selected sensing amplifier in the memory array according to the internal single-pulse clock signals CCLK1-CCLK4 and the control signal CSL through the even write buffer 510 and the odd write buffer 520.

Figure 6A:
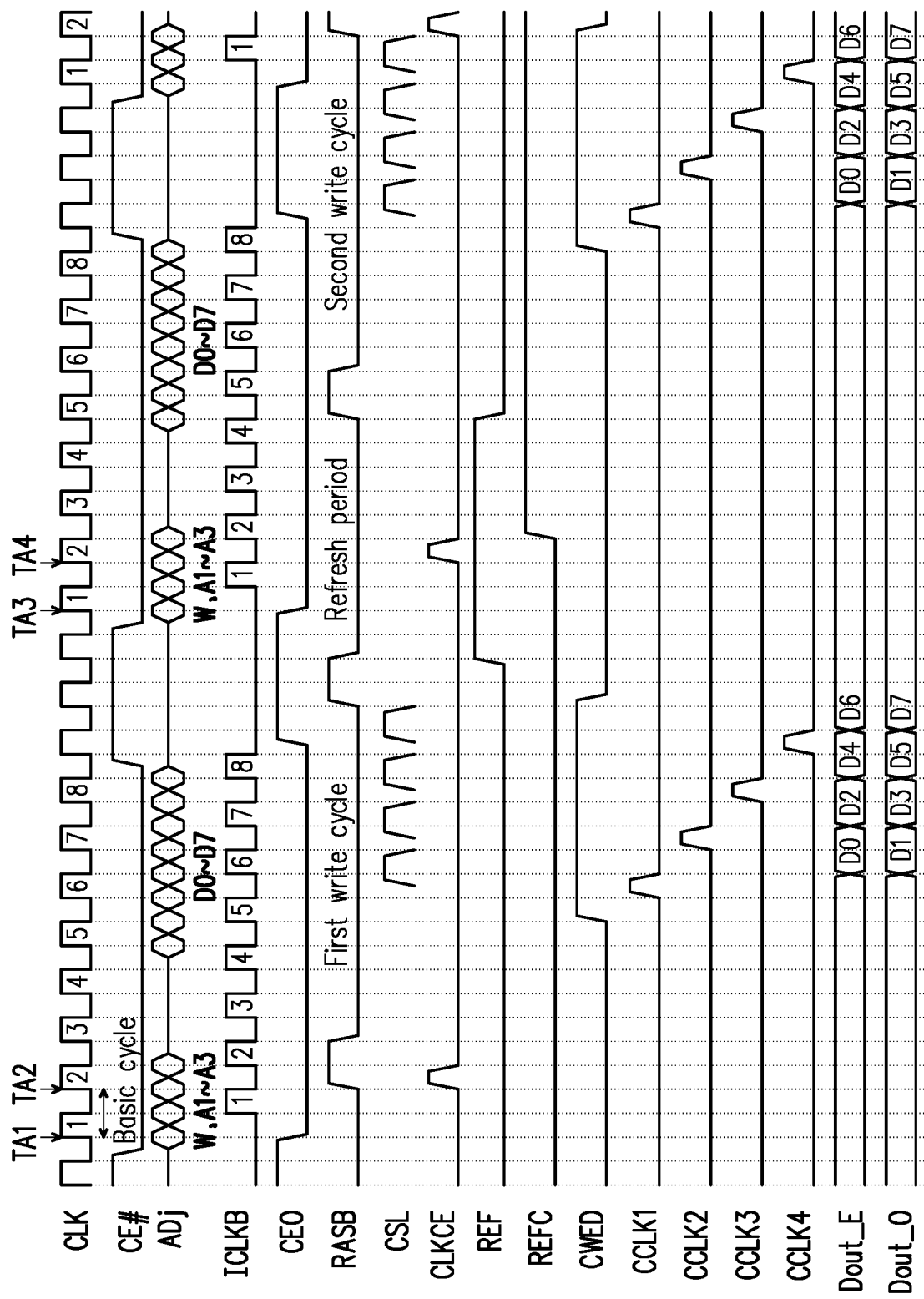
FIG. 6A and FIG. 6B are waveform schematic diagrams of a method for writing data according to an embodiment of the invention.
Figure 6B:
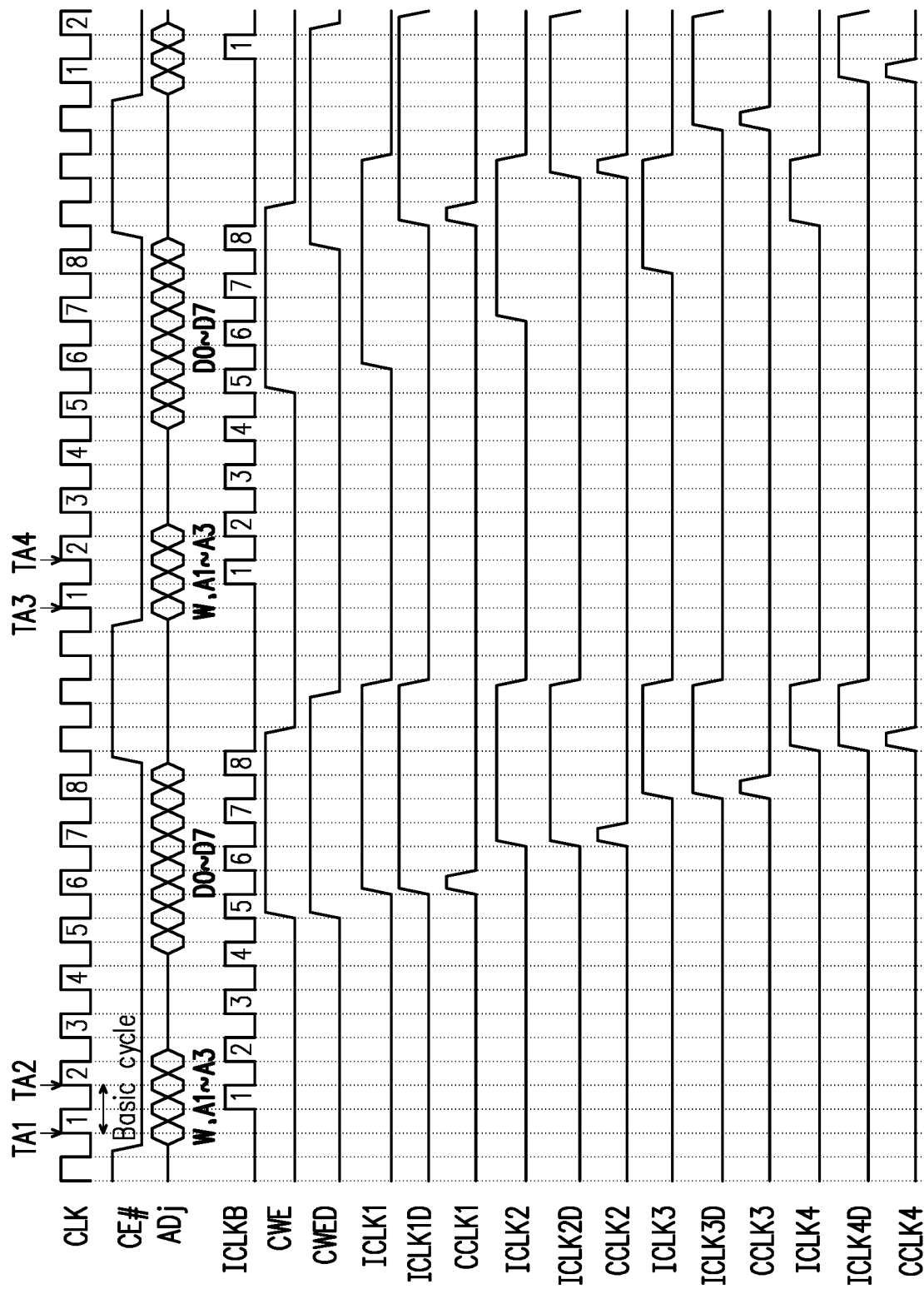

FIG. 6A and FIG. 6B are waveform schematic diagrams of a method for writing data according to an embodiment of the invention. Operations and timings of the various signals used in the aforementioned embodiments of FIG. 1 to FIG. 5 are described in detail below with reference to FIG. 6A and FIG. 6B. In view of working details of the pseudo static random access memory 100, the pseudo static random access memory 100 receives the basic clock signal CLK and the chip enable signal CE # through the controller 110. In the embodiment, the chip enable signal CE # is a low active signal, namely, when the chip enable signal CE # is in an enable state, the chip enable signal CE # is in a low logic level. Certainly, in other embodiments of the invention, the chip enable signal CE # may also be a high active signal, which is not limited by the invention.

In FIG. 6A, the chip enable signal CE # is enabled at a first time point TA1. Meanwhile, the controller 110 receives the chip enable signal CE # enabled at the first time point TA1 to execute a first write operation, and receives an address data signal ADj during a time interval that the chip enable signal CE # is enabled, such that address data W, A1-A3 and the write data Din (write data D0-D7) may be sequentially received.

As shown in FIG. 6A, the control logic circuit 210 of the controller 110 may generate the chip enable signal CE0 for internal use of the memory according to the chip enable signal CE #. Moreover, the clock buffer 220 of the controller 110 may generate the positive reference clock signal ICLKT and the inverted reference clock signal ICLKB during an enabled time interval of the chip enable signal CE0 according to the chip enable signal CE0 and the basic clock signal CLK.

When a write operation or a refresh operation is to be performed, the control logic circuit 210 in the controller 110 may enable a sub-word line driving signal RASB to activate a corresponding sub-word line in the memory array.

As shown in FIG. 6A, when the first write operation is to be performed, the control logic circuit 210 may be triggered by the chip enable signal CE # to generate the enable single-pulse signal CLKCE. At this moment, the refresh conflict determination circuit 230 in the controller 110 may determine whether the write operation and the refresh operation are conflicted according to the refresh signal REF indicating the refresh operation.

In FIG. 6A, after the single-pulse signal CLKCE of a second time point TA2 is generated, the refresh conflict signal REFC is not enabled by the refresh conflict determination circuit 230. Namely, the first write operation does not conflict with any refresh operation. Therefore, as shown in FIG. 6A and FIG. 6B, the delay circuit 430 in the internal clock generator 120 does not greatly delay the internal clock signals ICLK1-ICLK4 and the write command enable signal CWE, but directly converts the internal clock signals ICLK1-ICLK4 to 4 single-pulse clock signals CCLK1-CCLK4. Moreover, the write buffer 130 may sequentially write the odd data Dout_O and the even data Dout_E to the selected sensing amplifier in the memory array through 4 pulses of the control signal CSL according to the internal single-pulse clock signals CCLK1-CCLK4.

For simplicity's sake, besides the internal clock signals ICLK1-ICLK4 and the write command enable signal CWE representing original waveforms, in FIG. 6A and FIG. 6B, internal clock delay signals ICLK1D-ICLK4D and a write command enable delay signal CWED are also used to indicate a delay situation. Therefore, after the single-pulse signal CLKCE of the second time point TA2 is generated, since it is unnecessary to delay the internal clock signals ICLK1-ICLK4 and the write command enable signal CWE for the first write operation, waveforms of the internal clock signals ICLK1-ICLK4 and the internal clock delay signals ICLK1D-ICLK4D are the same, and waveforms of the write command enable signal CWE and the write command enable delay signal CWED are the same.

On the other hand, in FIG. 6A, the chip enable signal CE # is enabled at a third time point TA3. Meanwhile, the controller 110 receive the chip enable signal CE # enabled at the third time point TA3 to execute a second write operation.

However, as shown in FIG. 6A, after the single-pulse signal CLKCE of a fourth time point TA4 is generated, the refresh conflict signal REFC is enabled by the refresh conflict determining circuit 230. Namely, the second write operation may conflict with the refresh operation. Therefore, as shown in FIG. 6A and FIG. 6B, the delay circuit 430 in the internal clock generator 120 may greatly delays the internal clock signals ICLK1-ICLK4 and the write command enable signal CWE (represented as the internal clock delay signals ICLK1D-ICLK4D and the write command enable delay signal CWED in FIG. 6A and FIG. 6B), so as to successfully complete the refresh operation.

Moreover, the write buffer 130 may sequentially write the odd data Dout_O and the even data Dout_E to the selected sensing amplifier in the memory array through 4 pulses of the control signal CSL according to the internal single-pulse clock signals CCLK1-CCLK4 converted from the delayed internal clock signals ICLK1-ICLK4 (represented as the internal clock delay signals ICLK1D-ICLK4D in FIG. 6B), so as to achieve an effect of delaying the write operation.

Figure 7:
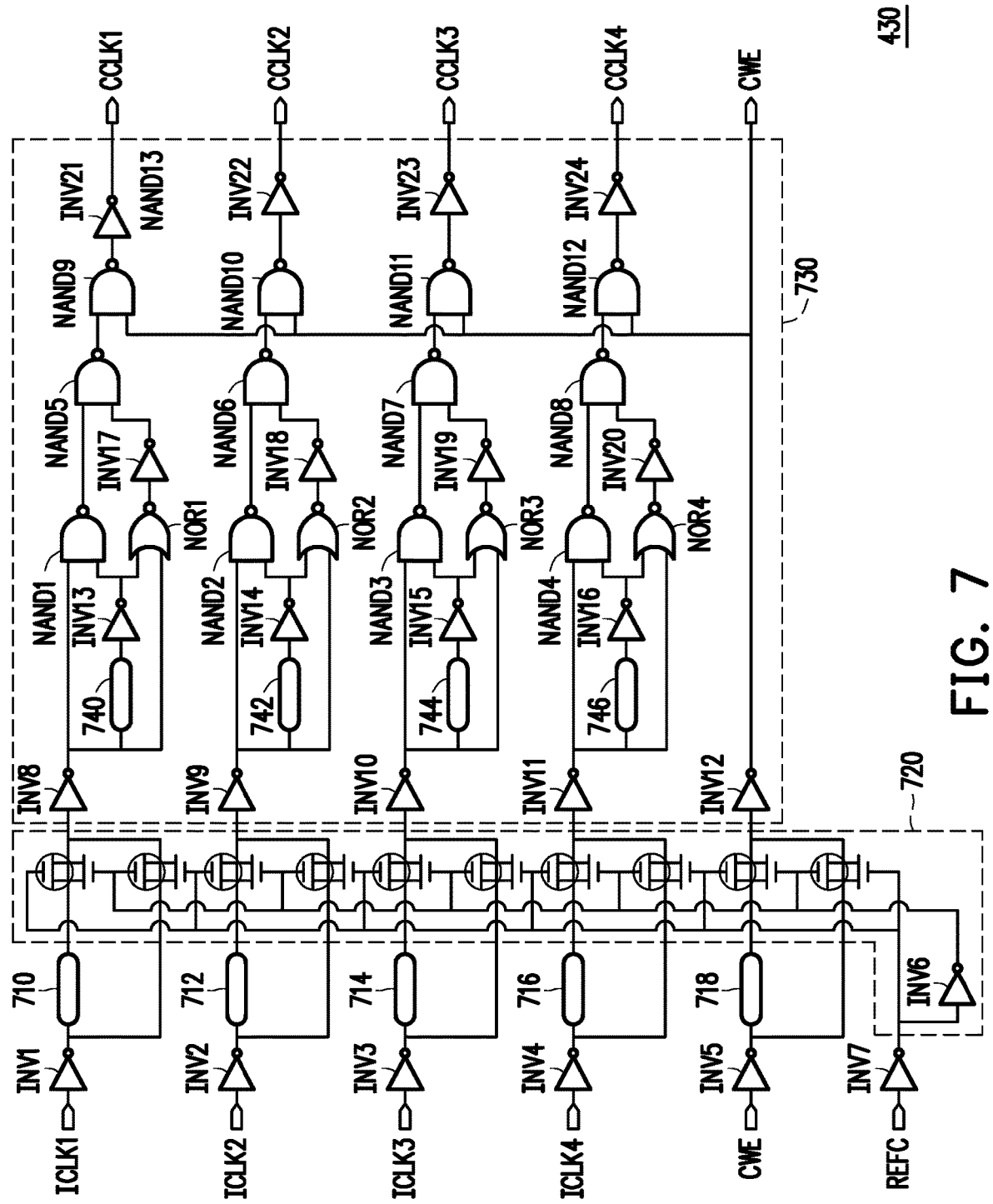
FIG. 7 is a schematic diagram of a delay circuit according to an embodiment of the invention.

A detailed structure of the delay circuit 430 is described below. FIG. 7 is a schematic diagram of a delay circuit according to an embodiment of the invention. Referring to FIG. 7, the delay circuit 430 includes long delay units 710-718, a switch circuit 720 and a conversion circuit 730. The delay circuit 430 may receive the internal clock signals ICLK1-ICLK4 and the write command enable signal CWE. In FIG. 7, the internal clock signals ICLK1-ICLK4 and the write command enable signal CWE may be transmitted to the long delay units 710-718 and the switch circuit 720 through inverters INV1-INV5.

In FIG. 7, the switch circuit 720 includes a plurality of switches and an inverter INV6. The refresh conflict signal REFC may be transmitted to the switch circuit 720 through an inverter INV7, so as to control the switch circuit 720. As shown in FIG. 7, the switches in the switch circuit 720 may be divided into path switches connected to the long delay units 710-718 and path switches not connected to the long delay units 710-718. The long delay units 710-718 are configured to greatly delay the internal lock signals ICLK1-ICLK4 and the write command enable signal CWE. When the refresh conflict signal REFC is not enabled, the path switches connected to the long delay units 710-718 are turned off, and the path switches not connected to the long delay units 710-718 are turned on. At this moment, the internal lock signals ICLK1-ICLK4 and the write command enable signal CWE do not pass through the long delay units 710-718, and the delay circuit 430 does not greatly delay the internal lock signals ICLK1-ICLK4 and the write command enable signal CWE. Conversely, when the refresh conflict signal REFC is enabled, the path switches connected to the long delay units 710-718 are turned on, and the path switches not connected to the long delay units 710-718 are turned off.

At this moment, the internal lock signals ICLK1-ICLK4 and the write command enable signal CWE pass through the long delay units 710-718, and the delay circuit 430 greatly delays the internal lock signals ICLK1-ICLK4 and the write command enable signal CWE.

The conversion circuit 730 includes inverters INV8-INV24, NAND gates NAND1-NAND12, NOR gates NOR1-NOR4 and delay units 740-746. As shown in the circuit configuration of FIG. 7, the conversion circuit 730 may convert the internal lock signals ICLK1-ICLK4 into 4 single-pulse clock signals CCLK1-CCLK4 to generate the signal waveforms shown in FIG. 6A and FIG. 6B.

Figure 8:
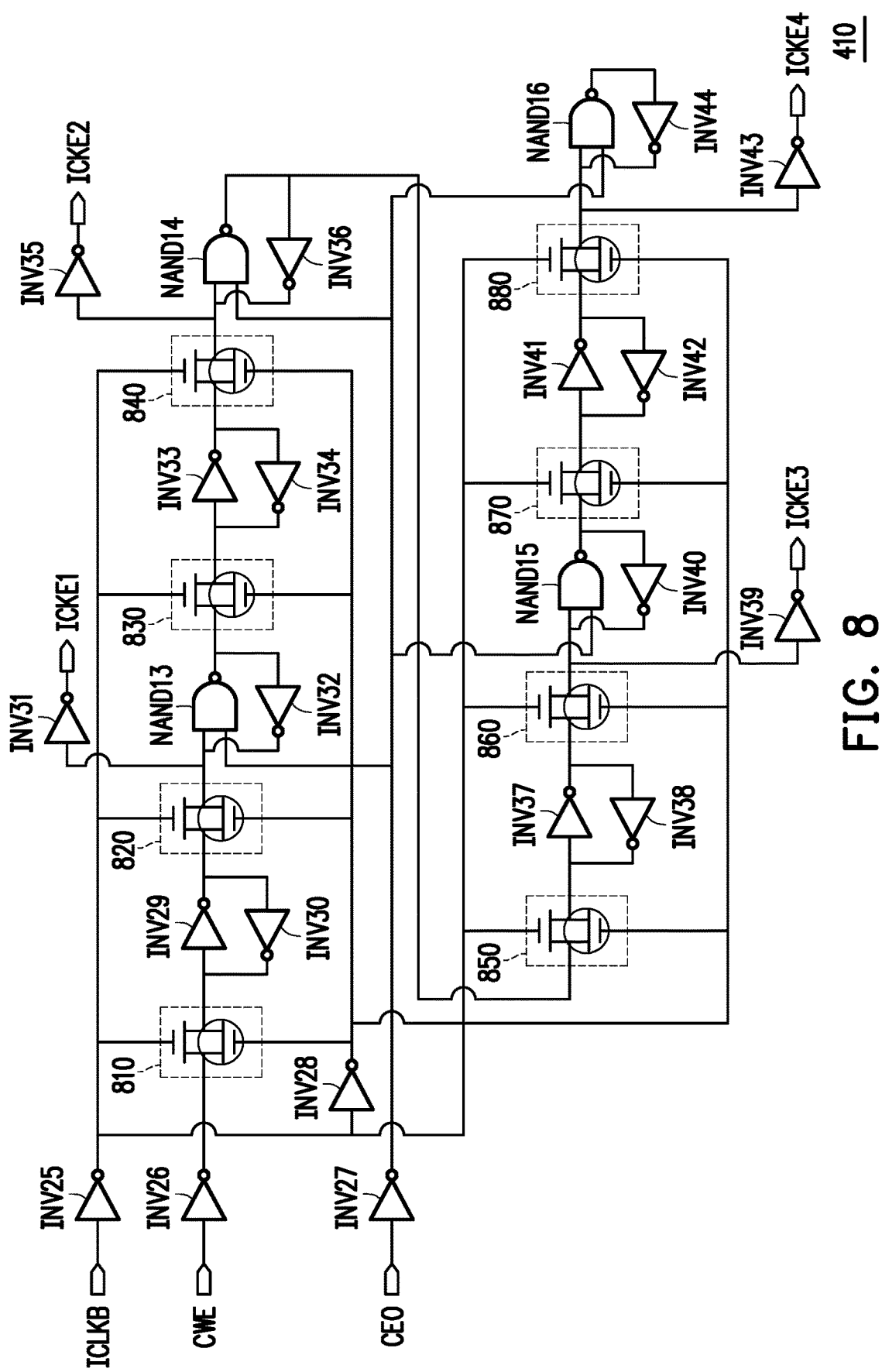
FIG. 8 is a schematic diagram of an enable signal generating circuit according to an embodiment of the invention.

A detailed structure of the enable signal generating circuit 410 is described below. FIG. 8 is a schematic diagram of an enable signal generating circuit according to an embodiment of the invention. Referring to FIG. 8, the enable signal generating circuit 410 includes inverters INV25-INV44, NAND gates NAND13-NAND 16 and switches 810-880.

The enable signal generating circuit 410 receives the inverted reference clock signal ICLKB, the write command enable signal CWE and the chip enable signal CE0 generated by the control logic circuit 210, and respectively inputs the inverted reference clock signal ICLKB, the write command enable signal CWE and the chip enable signal CE0 to the inverters INV25-INV27.

As shown in FIG. 8, the switches 810-880 are controlled by the inverted reference clock signal ICLKB. As shown in the circuit configuration of FIG. 8, the enable signal generating circuit 410 may sequentially generate 4 internal clock enable signals ICKE1-ICKE4 at intervals of the basic cycle according to the write command enable signal CWE and the chip enable signal CE0 through control of the switches 810-880, so as to generate the signal waveforms shown in FIG. 6A and FIG. 6B.

The internal clock generating circuit 420 may generate the internal clock signals ICLK1-ICLK4 according to the internal clock enable signals ICKE1-ICKE4 and the positive reference clock signal ICLKT. In a following FIG. 9, a circuit structure used for generating the internal clock signal ICLK1 is taken as an example to describe the structure of the internal clock generating circuit 420. Moreover, the circuit structures used for generating the other internal clock signals ICLK2-ICLK4 may be deduced by analogy.

Figure 9:
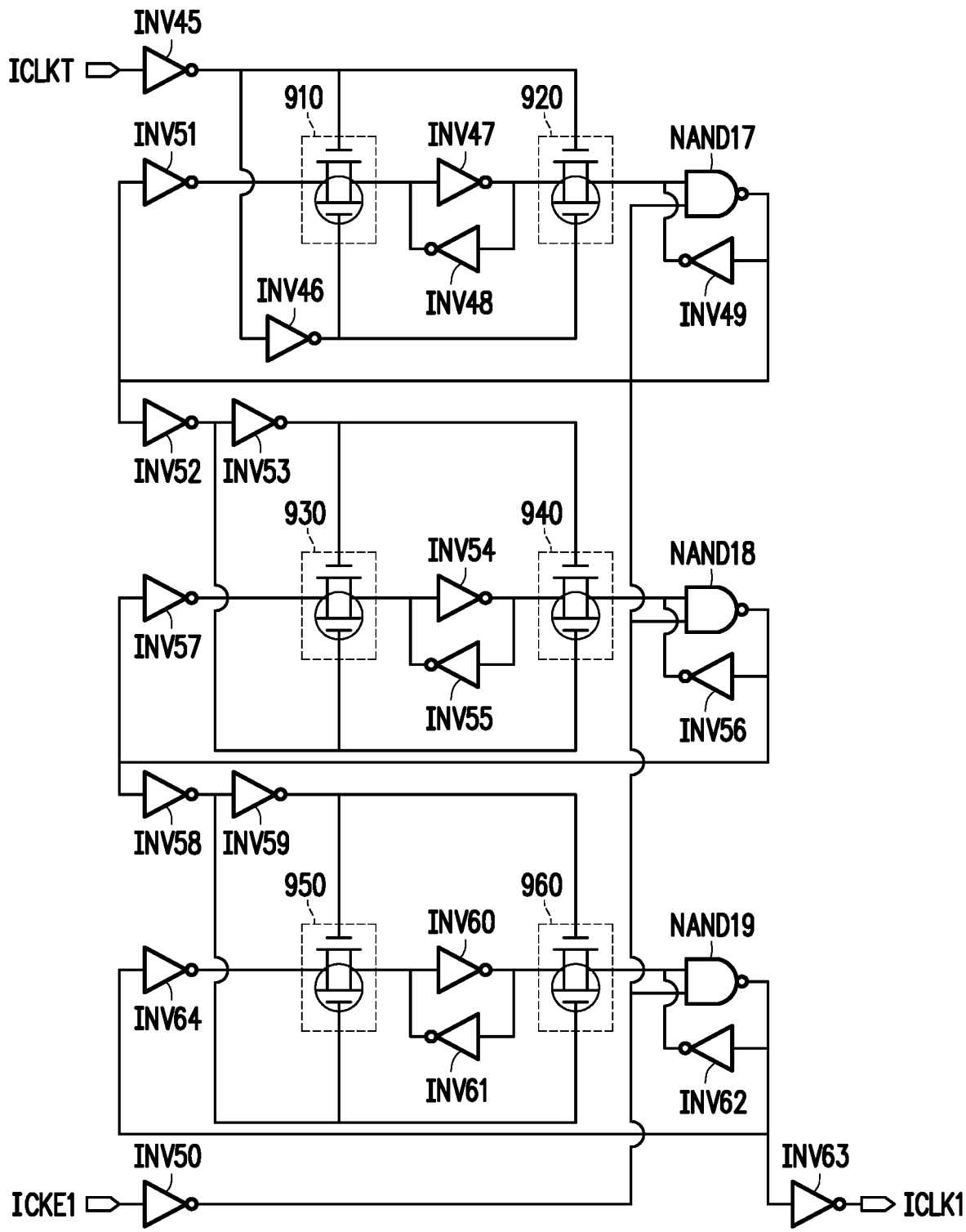
FIG. 9 is a partial schematic diagram of an internal clock generating circuit according to an embodiment of the invention.

FIG. 9 is a partial schematic diagram of an internal clock generating circuit according to an embodiment of the invention. Referring to FIG. 9, the internal clock generating circuit 420 includes inverters INV45-INV64, NAND gates NAND17-NAND19 and switches 910-960.

The internal clock generating circuit 420 receives the positive reference clock signal ICLKT and the internal clock enable signal ICKE1. The switches 910-960 are controlled by the positive reference clock signal ICLKT. As shown in the circuit configuration of FIG. 9, the internal clock generating circuit 420 may generate the internal clock signal ICLK1 with a cycle that is 8 times of the basic cycle according to the internal clock enable signal ICKE1 through control of the switches 910-960, so as to generate the signal waveforms shown in FIG. 6A and FIG. 6B.

Figure 10:
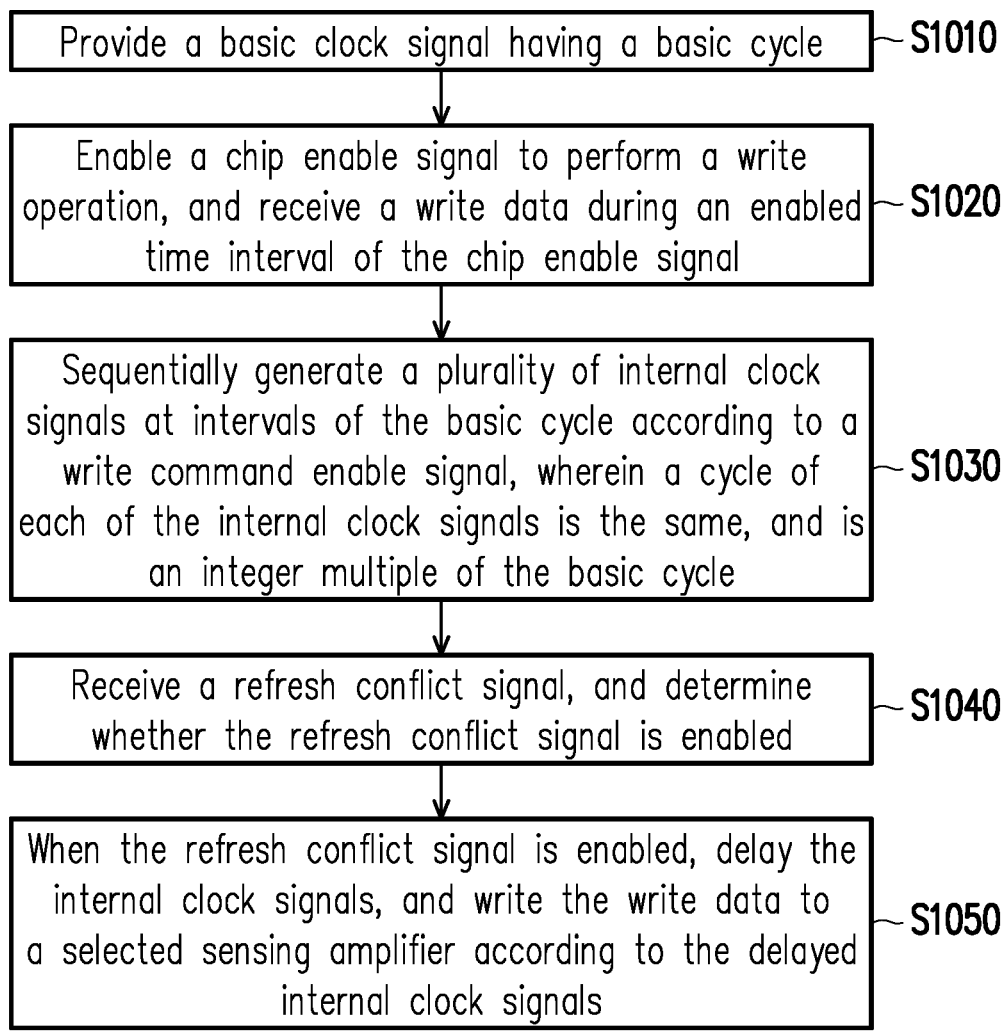
FIG. 10 is a flowchart illustrating a method for writing data of the pseudo static random access memory according to an embodiment of the invention.

FIG. 10 is a flowchart illustrating a method for writing data of the pseudo static random access memory according to an embodiment of the invention. Referring to FIG. 10, in the embodiment, the method for writing data of the pseudo static random access memory includes following steps. A basic clock signal having a basic cycle is provided (step S1010). A chip enable signal is enabled to perform a write operation, and write data is received during an enabled time interval of the chip enable signal (step S1020). Moreover, a plurality of internal clock signals is sequentially generated at intervals of the basic cycle according to a write command enable signal, where a cycle of each of the internal clock signals is the same, and is am integer multiple of the basic cycle (step S1030). Then, a refresh conflict signal is received, and it is determined whether the refresh conflict signal is enabled (step S1040). Finally, when the refresh conflict signal is enabled, the internal clock signals are delayed, and the write data is written to a selected sensing amplifier according to the delayed internal clock signals (step S1050). The sequence of the above steps S1010, S1020, S1030, S1040 and S1050 are only used as an example, and the embodiment of the invention is not limited thereto. Moreover, details of the above steps S1010, S1020, S1030, S1040 and S1050 may refer to the embodiments of FIG. 1 to FIG. 9, which are not repeated.

In summary, the pseudo static random access memory of the invention is capable of performing the write operation according to a plurality of internal clock signals. When the periodically generated refresh operation conflicts with the write operation, the pseudo static random access memory of the invention is capable of delaying a time of the write operation by delaying the internal clock signals without shortening the refresh period. In this way, the refresh operation and the write operation may be smoothly executed without increasing power consumption.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A method for writing data, adapted to a pseudo static random access memory, the method for writing data comprising:
    providing a basic clock signal having a basic cycle;
    enabling a chip enable signal to perform a write operation, and receiving a write data during an enabled time interval of the chip enable signal;
    sequentially generating a plurality of internal clock signals at intervals of the basic cycle according to a write command enable signal, wherein the falling edges of the internal clock signals are at the same time;
    receiving a refresh conflict signal, and determining whether the refresh conflict signal is enabled; and
    when the refresh conflict signal is enabled, delaying the internal clock signals, and respectively writing a plurality of data contained in the write data to at least one selected sensing amplifier in sequence according to the delayed internal clock signals,
    wherein before the step of receiving the refresh conflict signal, the method further comprises:
    enabling the refresh conflict signal when a refresh operation conflicts with the write operation.

2. The method for writing data as claimed in claim 1, wherein after the step of determining whether the refresh conflict signal is enabled, the method further comprises:
    when the refresh conflict signal is not enabled, writing the write data to the at least one selected sensing amplifier according to the internal clock signals that are not delayed.

3. The method for writing data as claimed in claim 1, further comprising:
    generating a positive reference clock signal and an inverted reference clock signal during the enabled time interval of the chip enable signal according to the chip enable signal and the basic clock signal.

4. The method for writing data as claimed in claim 3, wherein the step of sequentially generating the internal clock signals at intervals of the basic cycle according to the write command enable signal comprises:
    sequentially generating a plurality of internal clock enable signals at intervals of the basic cycle according to the write command enable signal and the inverted reference clock signal; and
    generating the internal clock signals according to the internal clock enable signals and the positive reference clock signal.

5. The method for writing data as claimed in claim 1, wherein the step of enabling the refresh conflict signal when the refresh operation conflicts with the write operation comprises:
    receiving a refresh signal indicating to perform the refresh operation and an enable single-pulse signal generated through triggering of the chip enable signal; and enabling the refresh conflict signal according to the chip enable signal and the refresh signal when the enable single-pulse signal is generated.

6. The method for writing data as claimed in claim 1, wherein the write data comprises an odd data and an even data, and the step of respectively writing the plurality of data contained in the write data to the at least one selected sensing amplifier in sequence according to the delayed internal clock signals comprises:
converting the delayed internal clock signals into a plurality of single-pulse clock signals; and
simultaneously writing the odd data and the even data to the at least one selected sensing amplifier according to the single-pulse clock signals.

7. The method for writing data as claimed in claim 1, wherein a cycle of each of the internal clock signals is the same, and is an integer multiple of the basic cycle.

8. The method for writing data as claimed in claim 1, wherein when the refresh conflict signal is enabled, delaying the internal clock signals, and respectively writing a plurality of data contained in the write data to at least one selected sensing amplifier in sequence according to the delayed internal clock signals, to delay a time of the write operation.

9. A pseudo static random access memory, comprising:
a controller, configured to receive a basic clock signal having a basic cycle and a chip enable signal to perform a write operation;
an internal clock generator, coupled to the controller, and configured to sequentially generate a plurality of internal clock signals at intervals of the basic cycle according to a write command enable signal transmitted by the controller, wherein the falling edges of the internal clock signals are at the same time; and
a write buffer, coupled to the controller and the internal clock generator, and configured to respectively write a plurality of data contained in a write data to at least one selected sensing amplifier in sequence according to the internal clock signals,
wherein when a refresh conflict signal is enabled, the internal clock generator delays the internal clock signals,
wherein the controller comprise a refresh conflict determining circuit, the refresh conflict determining circuit enables the refresh conflict signal when a refresh operation conflicts with the write operation.

10. The pseudo static random access memory as claimed in claim 9, wherein the controller comprises a clock buffer, and the clock buffer generates a positive reference clock signal and an inverted reference clock signal during the enabled time interval of the chip enable signal according to the chip enable signal and the basic clock signal.

11. The pseudo static random access memory as claimed in claim 10, wherein the internal clock generator comprises:
an enable signal generating circuit, configured to sequentially generate a plurality of internal clock enable signals at intervals of the basic cycle according to the write command enable signal and the inverted reference clock signal;
an internal clock generating circuit, coupled to the enable signal generating circuit, and configured to generate the internal clock signals according to the internal clock enable signals and the positive reference clock signal; and
a delay circuit, coupled to the internal clock generating circuit, and delaying the internal clock signals when the refresh conflict signal is enabled.

12. The pseudo static random access memory as claimed in claim 11, wherein the write data comprises an odd data and an even data, the delay circuit converts the internal clock signals into a plurality of single-pulse clock signals, and transmits the single-pulse clock signals to the write buffer,
the write buffer simultaneously writes the odd data and the even data to the at least one selected sensing amplifier according to the single-pulse clock signals.

13. The pseudo static random access memory as claimed in claim 9, wherein the controller further comprises:
a control logic circuit, coupled to the refresh conflict determining circuit, and configured to generate an enable single-pulse signal through triggering of the chip enable signal,
wherein the refresh conflict determining circuit receives a refresh signal indicating to perform the refresh operation and the enable single-pulse signal, and enable the refresh conflict signal according to the chip enable signal and the refresh signal when the enable single-pulse signal is generated.

14. The pseudo static random access memory as claimed in claim 9, wherein a cycle of each of the internal clock signals is the same, and is an integer multiple of the basic cycle.

15. The pseudo static random access memory as claimed in claim 9, wherein when the refresh conflict signal is enabled, the internal clock generator delays the internal clock signals and the write buffer respectively write the plurality of data contained in the write data to at least one selected sensing amplifier in sequence according to the internal clock signals, to delay a time of the write operation.

* * * * *